United States Patent
Zhang et al.

(10) Patent No.: US 8,190,384 B2
(45) Date of Patent: May 29, 2012

(54) METHOD AND SYSTEM FOR OPERATING A BATTERY IN A SELECTED APPLICATION

(75) Inventors: Xiangchun Zhang, Ann Arbor, MI (US);
Yen-Hung Chen, Ann Arbor, MI (US);
Chia-Wei Wang, Ypsilanti, MI (US);
Ann Marie Sastry, Ann Arbor, MI (US)

(73) Assignee: Sakti3, Inc., Ann Arbor, MI (US)

( * ) Notice: Subject to any disclaimer, the term of this patent is extended or adjusted under 35 U.S.C. 154(b) by 0 days.

(21) Appl. No.: 13/283,524

(22) Filed: Oct. 27, 2011

(65) Prior Publication Data

US 2012/0041698 A1    Feb. 16, 2012

(51) Int. Cl.
*G01R 31/36*    (2006.01)

(52) U.S. Cl. ............ 702/63; 702/57; 702/58; 702/60; 702/64; 702/65; 702/130; 702/136; 702/179; 702/182; 702/183; 702/185; 702/190; 320/127; 320/132; 320/149; 320/150; 320/134; 320/136; 320/101

(58) Field of Classification Search .............. 702/57, 702/58, 60, 63–65, 130, 136, 179, 181–183, 702/185, 187, 190; 320/101, 127, 132, 134, 320/136, 149–150
See application file for complete search history.

(56) References Cited

U.S. PATENT DOCUMENTS 7,315,789 B2 * 1/2008 Plett ............................... 702/63

* cited by examiner

*Primary Examiner* — Sujoy Kundu
(74) *Attorney, Agent, or Firm* — Richard T. Ogawa; Ogawa P.C.

(57) ABSTRACT

A method of the present invention using a prediction process including a battery equivalent circuit model used to predict a voltage and a state of charge of a battery. The equivalent circuit battery model includes different equivalent circuit models consisting of at least an ideal DC power source, internal resistance, and an arbitrary number of representative parallel resistors and capacitors. These parameters are obtained a priori by fitting the equivalent circuit model to battery testing data. The present invention further uses a correction process includes determining a corrected predicted state of charge of the battery; and storing the corrected state of charge of the battery in a storage medium. In the present invention, an expectation of the predicted voltage of the battery and an expectation of the predicted state of charge of the battery are obtained by an unscented transform with sigma points selected by a Gaussian process optimization.

20 Claims, 9 Drawing Sheets

| Approach\estimation error measure | Extended Kalman filter | Unscented transform based prediction-correction filter |
|---|---|---|
| Mean of root mean square error of state of charge estimation (50 runs) | 0.0475 | 0.0135 |
| Standard deviation of root mean square error of state of charge estimation (50 runs) | 0.022 | 0.0023 |

METHOD AND SYSTEM FOR OPERATING A BATTERY IN A SELECTED APPLICATION

CROSS-REFERENCES TO RELATED APPLICATIONS

The present application incorporates by reference, for all purposes, the following U.S. patent: U.S. Pat. No. 7,315,789, filed Nov. 23, 2004.

BACKGROUND OF THE INVENTION

This present invention relates to manufacture of electrochemical cells. More particularly, the present invention provides a method and a system for operating a battery in a selected application. Merely by way of example, the invention has been provided with use of lithium based battery cells, but it would be recognized that other battery cells made from materials such as zinc, silver and lead, nickel could be operated in the same or like fashion. Additionally, such batteries can be used for a variety of applications such as portable electronics (cell phones, personal digital assistants, music players, video cameras, and the like), tablet and laptop computers, power tools, power supplies for military use (communications, lighting, imaging and the like), power supplies for aerospace applications (power for satellites and micro air vehicles), and power supplies for vehicle applications (hybrid electric vehicles, plug-in hybrid electric vehicles, and fully electric vehicles). The method and system for operation of such batteries are also applicable to cases in which the battery is not the only power supply in the system, and additional power is provided by a fuel cell, other batteries, an IC engine or other combustion devices, capacitors, solar cells, etc.

In the context of batteries, it is desired in some applications to be able to estimate quantities that are descriptive of the present battery condition, but that may not be directly measured. Some of these quantities may change rapidly, such as the sate of charge, which can traverse its entire range within minutes. In the context of the battery systems, particularly those that need to operate for long period of time, as aggressively as possible without harming the battery life, for example, in hybrid electric vehicle batteries, laptop computer batteries, portable tool batteries, and the like, it is desired that information regarding state of charge is accurate and fast so one can further control the power/energy output of the batteries, determine if it is necessary to charge the batteries, and determine the health of batteries.

As an example, the use of estimation of parameters for a battery cell has been described in U.S. Pat. No. 7,315,789, in the name of Gregory L. Plett and assigned to LG Chemical Ltd., which is incorporated by reference herein. Plett disclosed the use of a Kalman filter and/or extended Kalman filter. Limitations, however, exists. Although somewhat successful, Plett's techniques are not robust and yield poor performance since they fail to converge for highly nonlinear cases, are cumbersome, and difficult to apply in complex electrochemical systems. These and other limitations are overcome by the present method and system as further described throughout the present specification below.

BRIEF SUMMARY OF THE INVENTION

According to the present invention, techniques related to the manufacture of electrochemical cells are provided. More particularly, the present invention provides a method for operating a battery in a selected application. Additionally, the present invention provides a system for operating a battery in a selected application. Merely by way of example, the invention has been provided with use of lithium based battery cells, but it would be recognized that other battery cells made from materials such as zinc, silver and lead, nickel could be operated in the same or like fashion. Additionally, such batteries can be used for a variety of applications such as portable electronics (cell phones, personal digital assistants, music players, video cameras, and the like), tablet and laptop computers, power tools, power supplies for military use (communications, lighting, imaging and the like), power supplies for aerospace applications (power for satellites and micro air vehicles), and power supplies for vehicle applications (hybrid electric vehicles, plug-in hybrid electric vehicles, and fully electric vehicles).

In a specific embodiment, the present invention provides a method for operating a battery in an application. The application is selected from one of a mobile communication device, a vehicle, display device, or computing device. The method includes a process for monitoring and predicting a state of a battery device while the battery device is configured with the application. The method includes detecting a current and a voltage of the battery device in the application using one or more sensing device coupled to an electronic circuit structure. The method also includes capturing a current value associated with the current and a voltage value associated with the voltage. The method also includes processing the current value and the voltage value and determining a state of charge of the battery device using at least a prediction and a correction process including the current value and the voltage value, an arbitrary number of representative resistors and capacitors associated with a battery model. The prediction-correction process comprises an unscented transform based filter where the expectation and covariance of stochastic variables of voltage and state of charge are calculated by unscented transform. Additionally, the unscented transform uses scaling parameters specified a priori or obtained by a Gaussian process optimization for selection of more than two Sigma points to approximate the expectation and covariance of randomly distributed variables such as state of charge and voltage of a battery cell. As an example, the prediction process includes a battery model used to estimate a voltage includes different equivalent circuit models consisting of at least an ideal DC power source, internal resistance, and an arbitrary number of representative parallel resistors and capacitors. The arbitrary number includes zero and any positive integer. In a preferred embodiment, the correction process includes determining a difference between the measured voltage and an expectation of predicted voltage to obtain a difference voltage value. The expectation and covariance of voltage and state of charge are obtained by unscented transform. The correction process also includes multiplying the difference value by a gain factor to obtain a correction value. The gain factor is determined by dividing the covariance of the stochastic variables of voltage and state of charge by the covariance of the stochastic variables of voltage and voltage. Additionally, correction process includes adding the correction value to the predicted expectation of the cell state of charge to obtain a corrected predicted state of charge of the battery cell and storing the corrected state of charge of the battery cell in a storage medium. The method of the present invention for operating an application also includes storing the state of charge in one or more memories, outputting the stating of charge, and using the state of charge for the application.

In an alternative specific embodiment, the method of the present invention uses a prediction process including a battery model used to estimate a voltage includes different equivalent circuit models consisting of at least an ideal DC power source, internal resistance, and an arbitrary number of representative parallel resistors and capacitors. Additionally, the battery equivalent circuit model uses parameters for resistors and capacitors. These parameters are obtained a priori by fitting the equivalent circuit model to battery testing data. These parameters can also be obtained concurrently or jointly with state of charge of the battery cell.

In a preferred embodiment, the method of the present invention using one or more sensing device coupled to an electronic circuit structure. Additionally, the electronic circuit structure comprises voltage sensing devices, current sensing devices, resistors, capacitors, electronic amplifier, analog-to-digital converters.

In a specific embodiment, the method of the present invention uses an unscented transform for obtaining the expectation and covariance of stochastic variables of voltage and state of charge of battery cells. Additionally, the unscented transform comprises scaling parameters specified a priori or obtained by a Gaussian process optimization for selection of more than two Sigma points to approximate the expectation and covariance of randomly distributed variables such as state of charge and voltage of a battery cell. The unscented transform based prediction-correction filter calculates the innovation covariance using a fixed forgetting factor or an exponentially annealed forgetting factor.

In an alternative specific embodiment, the present invention provides a system for operating a battery in an application, the application is selected from one of a mobile communication device, a vehicle, display device, or computing device, the system monitoring and predicting a state of a battery device while the battery device is configured with the application. The system includes at least one sensing device configured for detecting a current value and a voltage value of the battery device in the application. The system also includes an electronic circuit configured for capturing the current value associated with the current and the voltage value associated with the voltage. Additionally, the system includes a processing unit coupled to the electronic circuit, the processing unit configured to execute one or more instructions, the one or more instructions including a process for initialization of determining a state of charge of the battery device using at least a prediction and a correction process including the current value and the voltage value, an arbitrary number of representative resistors and capacitors associated with a battery model, the prediction-correction process comprises an unscented transform based Prediction-correction filter; the unscented transform comprising a Gaussian process for selection of more than two Sigma points and one or more memory device configured to store a value associated with the state of charge. In a preferred embodiment, the system of the present invention also includes an output device to display the value associated with the state of charge.

Benefits are achieved over conventional techniques. In one or more embodiments, the present method and system for estimating charge of a battery device has better performance over the conventional techniques. The present method and system provide a more accurate estimation of the battery device state of charge. The present method and system converges better to the true state of charge owing to the unscented transform used for calculating the expectation and covariance of stochastic variables of battery device voltage and state of charge. The present method and system provide a more accurate estimation of state of charge because of the equivalent circuit model consisting of an arbitrary number of representative parallel resistors and capacitors to better model the polarizations inside electrochemical cells. The present method and system provide a more accurate estimation of state of charge further because of the Gaussian process optimization used for selecting sigma points in unscented transform.

Depending upon the specific embodiment, one or more of these benefits may be achieved. These and other benefits may be found throughout the present specification and more particularly below.

The present invention achieves these benefits and others in the context of known process technology. However, a further understanding of the nature and advantages of the present invention may be realized by reference to the latter portions of the specification and attached drawings.

BRIEF DESCRIPTION OF THE DRAWINGS

The following diagrams are merely examples, which should not unduly limit the scope of the claims herein. One of ordinary skill in the art would recognize many other variations, modifications, and alternatives. It is also understood that the examples and embodiments described herein are for illustrative purposes only and that various modifications or changes in light thereof will be suggested to persons skilled in the art and are to be included within the spirit and purview of this process and scope of the appended claims.

DETAILED DESCRIPTION OF THE INVENTION

According to the present invention, techniques related to the manufacture of electrochemical cells are provided. More particularly, the present invention provides a method for operating a battery in a selected application. Additionally, the present invention provides a system for operating a battery in a selected application. Merely by way of example, the invention has been provided with use of lithium based battery cells, but it would be recognized that other battery cells made from materials such as zinc, silver and lead, nickel could be operated in the same or like fashion. Additionally, such batteries can be used for a variety of applications such as portable electronics (cell phones, personal digital assistants, music players, video cameras, and the like), tablet and laptop computers, power tools, power supplies for military use (communications, lighting, imaging and the like), power supplies for aerospace applications (power for satellites and micro air vehicles), and power supplies for vehicle applications (hybrid electric vehicles, plug-in hybrid electric vehicles, and fully electric vehicles).

The present invention provides a method for operating a battery in an application. The application is selected from one of a mobile communication device, a vehicle, display device, or computing device. The method includes a process for monitoring and predicting a state of a battery device while the battery device is configured with the application. The method includes detecting a current and a voltage of the battery device in the application using one or more sensing device coupled to an electronic circuit structure. The method also includes capturing a current value associated with the current and a voltage value associated with the voltage. The method also includes processing the current value and the voltage value and determining a state of charge of the battery device using at least a prediction and a correction process including the current value and the voltage value, an arbitrary number of representative resistors and capacitors associated with a battery model. The prediction-correction process comprises an unscented transform based Prediction-correction filter where the expectation and covariance of stochastic variables of voltage and state of charge are calculated by unscented transform. Additionally, the unscented transform uses scaling parameters specified a priori or obtained by a Gaussian process optimization for selection of more than two Sigma points to approximate the expectation and covariance of randomly distributed variables such as state of charge and voltage of a battery cell. As an example, the prediction process includes a battery model used to estimate a voltage includes different equivalent circuit models consisting of at least an ideal DC power source, internal resistance, and an arbitrary number of representative parallel resistors and capacitors. The arbitrary number includes zero and any positive integer. In a preferred embodiment, the correction process includes determining a difference between the measured voltage and an expectation of predicted voltage to obtain a difference voltage value. The expectation and covariance of voltage and state of charge are obtained by unscented transform. The correction process also includes multiplying the difference value by a first gain factor to obtain a correction value. The gain factor is determined by dividing the covariance of the stochastic variables of voltage and state of charge by the covariance of the stochastic variables of voltage and voltage. Additionally, correction process includes adding the correction value to the predicted expectation of the cell state of charge to obtain a corrected predicted state of charge of the battery cell and storing the corrected state of charge of the battery cell in a storage medium. The method of the present invention for operating an application also includes storing the state of charge in one or more memories, outputting the stating of charge, and using the state of charge for the application.

Figure 1:
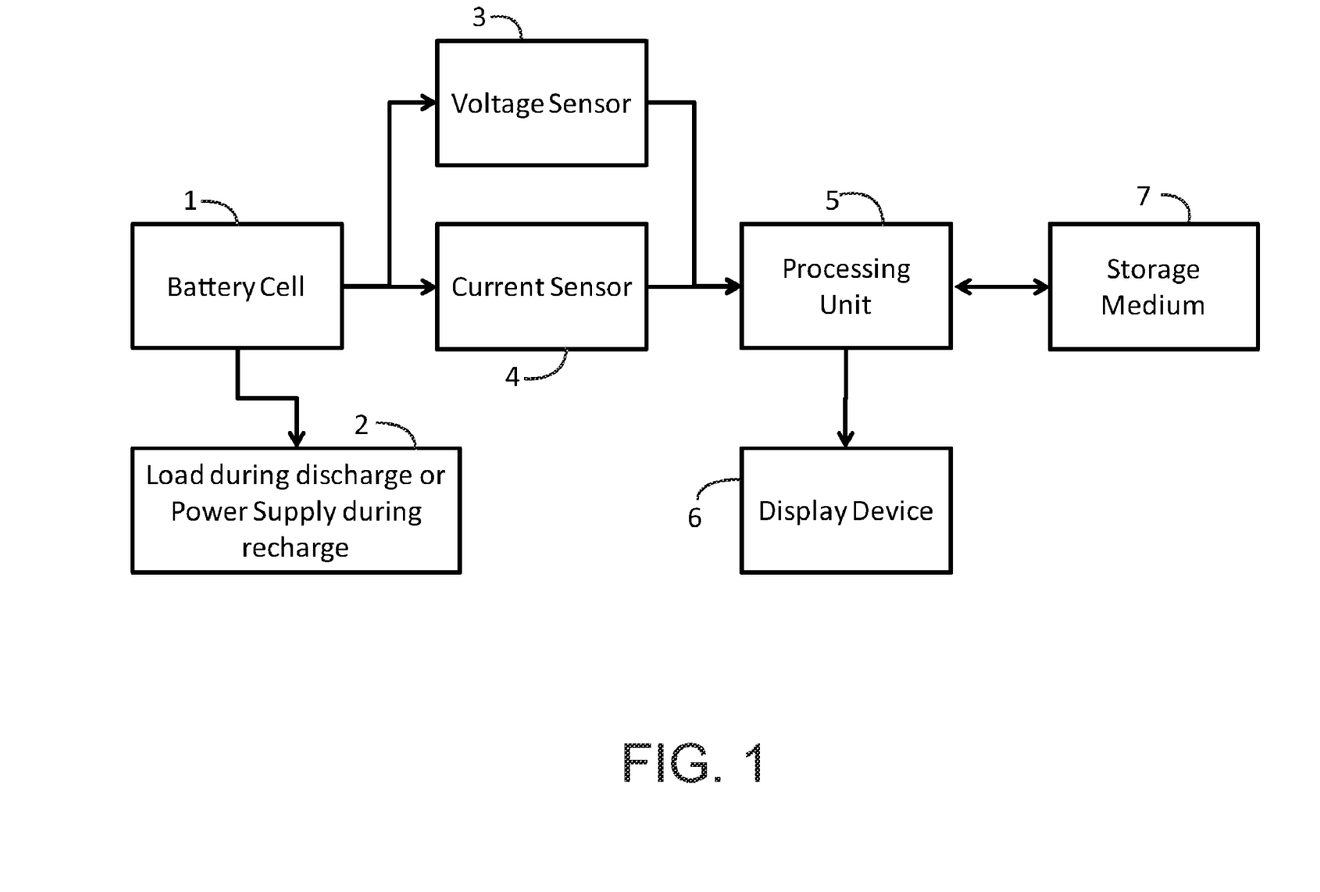
FIG. 1 is a simplified block diagram of a method and a system according to an embodiment of the present invention.

FIG. 1 illustrates a simplified block diagram of a method and a system according to an embodiment of the present invention. The system includes a battery cell 1, a current sensor 4, a voltage sensor 3, a processing unit 5, a storage medium 7, a load during discharge or power supply during recharge 2, a display device 6. This diagram is merely an illustration and should not unduly limit the scope of the claims herein. One of ordinary skill in the art would recognize many variations, modifications, and alternatives. The method includes detecting a current and a voltage of the battery device in the application using one or more current and voltage device coupled to an electronic circuit structure. The method also includes processing the current value and the voltage value and determining a state of charge of the battery device in a processing unit. Additionally, the method includes storing the state of charge in the storage medium and outputting the stating of charge.

Figure 2:
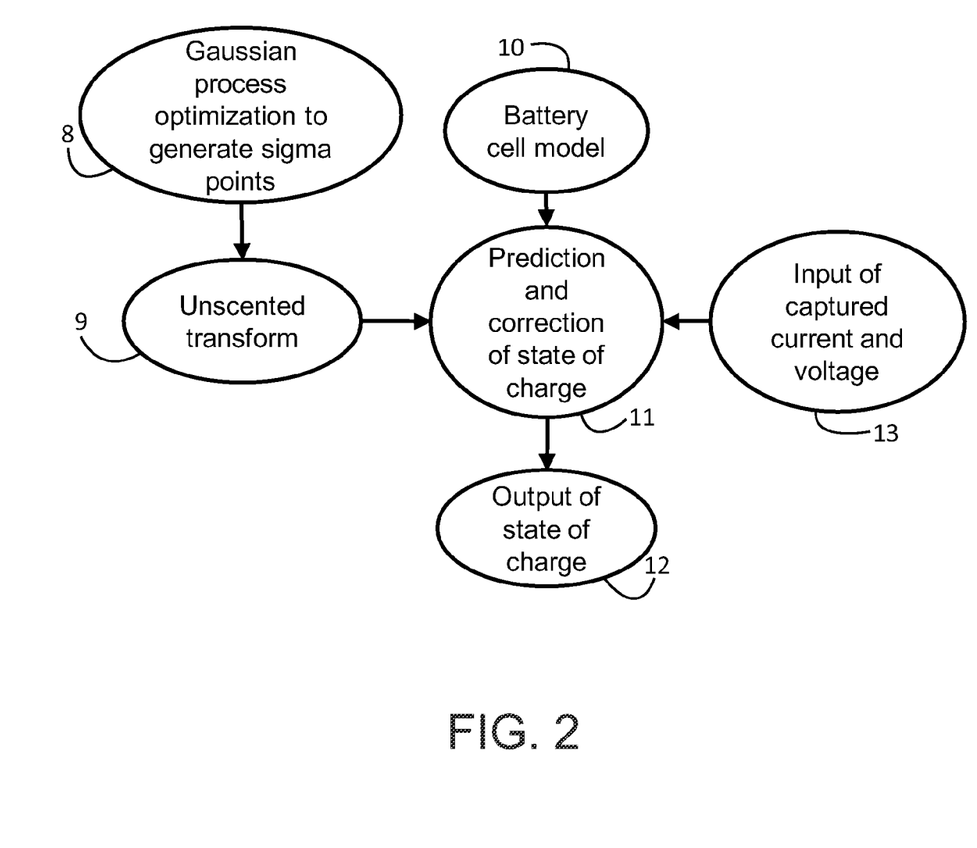
FIG. 2 is a simplified diagram of a method according to an embodiment of the present invention.

FIG. 2 is a simplified diagram of a method according to an embodiment of the present invention. FIG. 2 depicts the process modules used in the method. The process modules include a Gaussian process optimization to select sigma points 8, an unscented transform 9, a battery cell model 10, a prediction-correction filter 11, input of captured current and voltage 13, and output of estimated state of charge 12.

Figure 3:
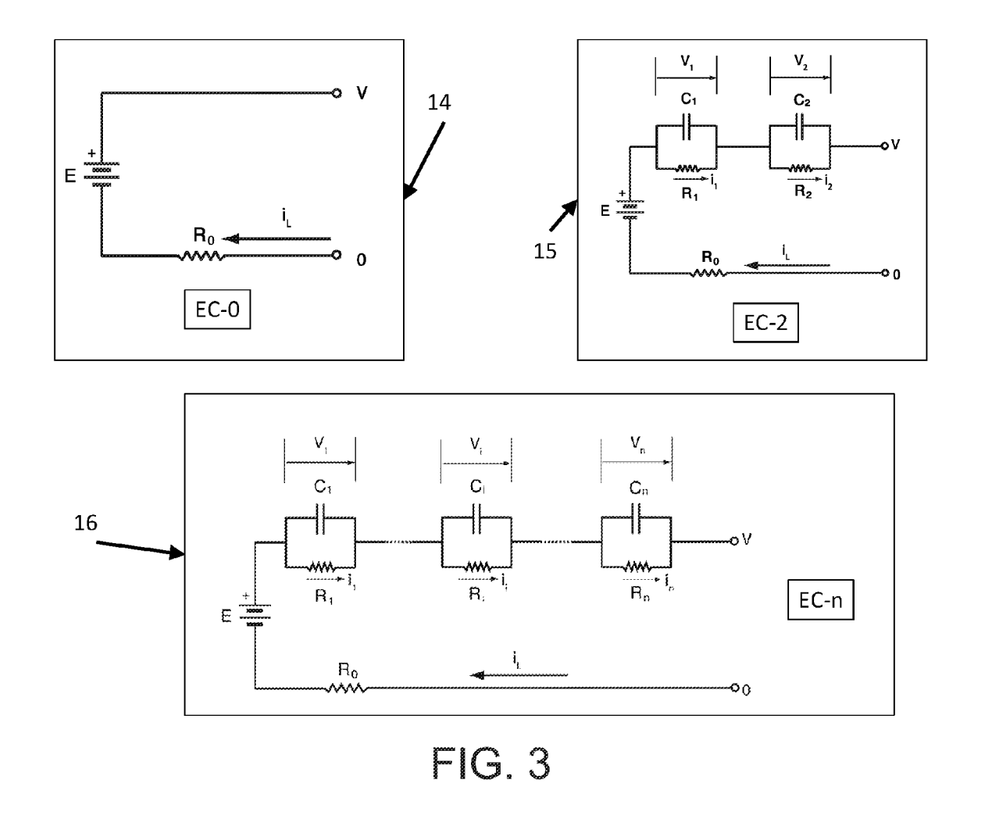
FIG. 3 is a simplified illustration of an equivalent circuit models setup with an arbitrary number of representative parallel resistors and capacitors.

FIG. 3 illustrates an equivalent circuit battery cell model setup with an arbitrary number of representative parallel resistors and capacitors. The equivalent circuit models consists of at least an ideal DC power source, internal resistance, and an arbitrary number of representative parallel resistors and capacitors, wherein the arbitrary number includes any positive integer and zero. As an example, EC-0 as 14 in FIG. 3 means the circuit model consisting of an ideal DC power source E, internal resistance $R_o$, and zero of representative parallel resistors and capacitors. As another example, EC-2 as 15 in FIG. 3 means the circuit model consisting of an ideal DC power source E, internal resistance $R_o$, and two of representative parallel resistors and capacitors including couples of $C_1$ and $R_1$, and $C_2$ and $R_2$. Alternatively, EC-n as 16 in FIG. 3 means the circuit model consisting of an ideal DC power source E, internal resistance $R_o$, and n of representative parallel resistors and capacitors including n couples of $C_1$ and $R_1$, $C_2$ and $R_2$, and so on until $C_n$ and $R_n$. For equivalent circuit model EC-n, output voltage:

$$V = E(soc) - i_L R_0 - \sum_{i=1}^{n} i_i R_i$$

where E is the open circuit voltage of the battery cell, soc is the state of charge of the battery cell, $i_L$ is the load current applied associated with the application of the battery cell, $i_i$ is the current through the resistor $R_i$, $i_i$ is calculated by:

$$i_i(t) = \int_0^t e^{-\frac{1}{\tau_i}(t-s)} \frac{1}{\tau_i} i_L(s) ds$$

as a solution of the differential equation formulated through current balance:

$$i_L(t) = i_i(t) + C_i \frac{d}{dt}[i_i(t)R_i]$$

where $\tau_i = R_i C_i$ and t is time.
The state of charge of the battery cell is calculated as:

$$soc = soc_0 - \int_0^t \frac{i_L(s)}{Q} ds$$

where $soc_0$ is the initial state of charge and Q is the total capacity of the battery cell.

Figure 4:
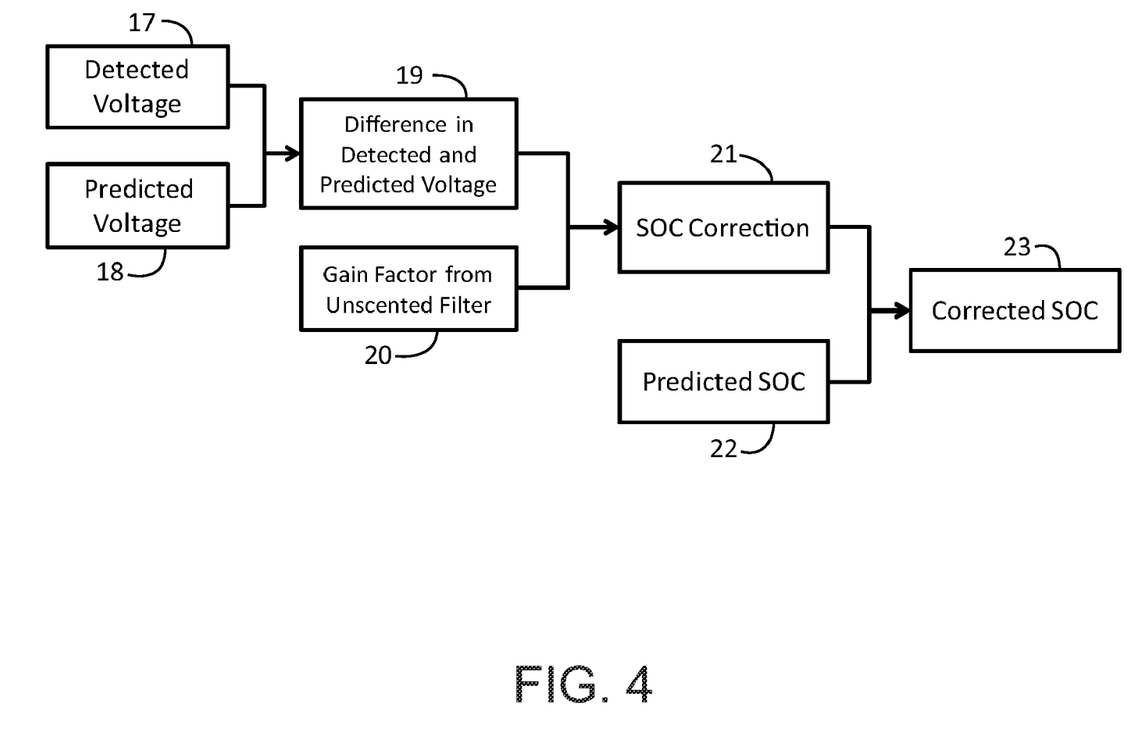
FIG. 4 is a simplified illustration of a process module.

FIG. 4 is a simplified flow diagram of a process for monitoring and predicting a state of a battery device according to an embodiment of the present invention. The method includes detecting a current and a voltage of the battery device in the application using one or more current and voltage device coupled to an electronic circuit structure. The method also includes processing the current value and the voltage value and determining a state of charge of the battery device in a processing unit. In a preferred embodiment, the correction process includes determining a difference between the measured voltage and a predicted voltage to obtain a difference voltage value. The predicted voltage is the expectation of the stochastic voltage variable and the expectation is calculated by unscented transform. The correction process also includes multiplying the difference value by a first gain factor to obtain a correction value. The gain factor is determined by covariance of stochastic variable of voltage and state of charge. Additionally, correction process includes adding the correction value to the predicted cell state of charge to obtain a corrected predicted state of charge of the battery cell. The corrected predicted state of charge of the battery cell is the final estimated state of charge and is stored a storage medium. The method of the present invention for operating an application also includes storing the state of charge in one or more memories, outputting the stating of charge, and using the state of charge for the application.

Figure 5:
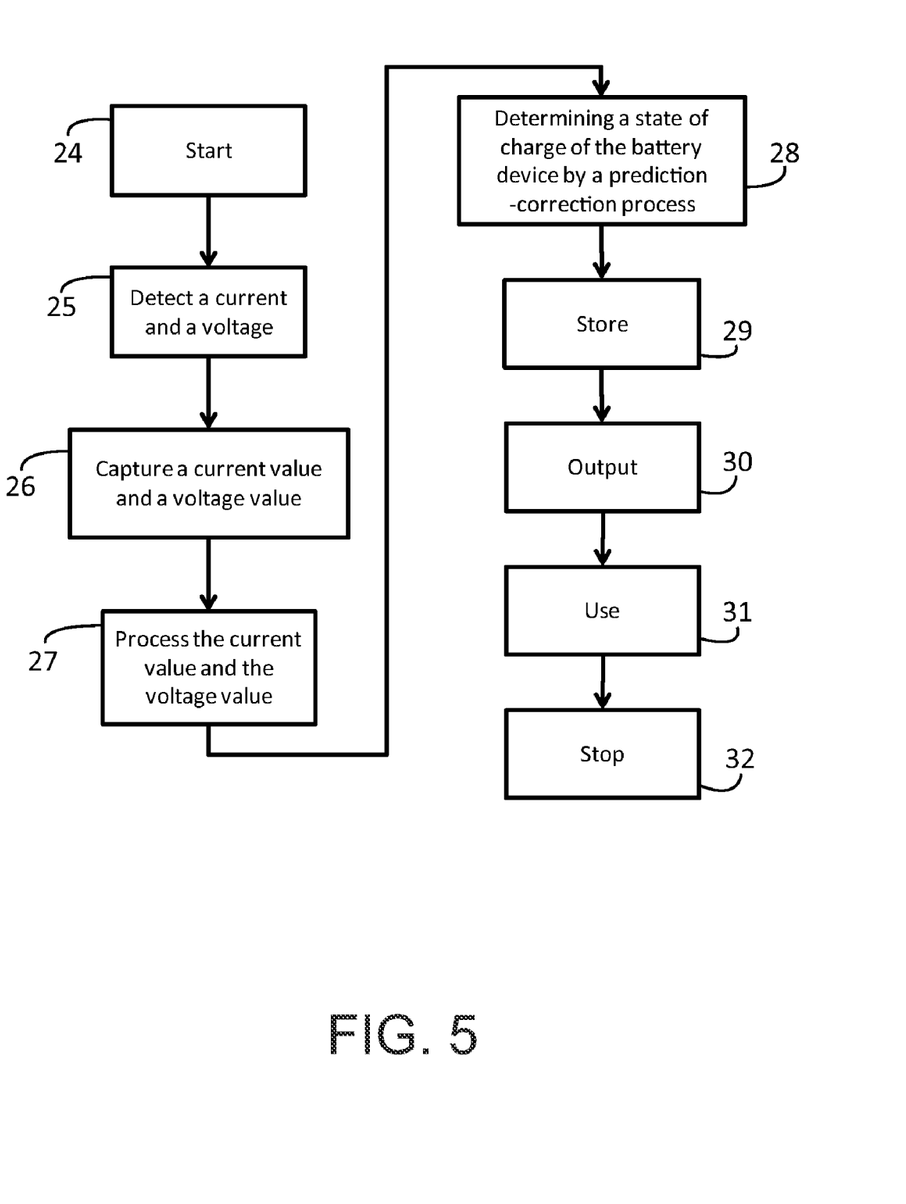
FIG. 5 is a simplified flow diagram of a process for monitoring and predicting a state of a battery device according to an embodiment of the present invention.

FIG. 5 is a simplified flow diagram of a process for monitoring and predicting a state of a battery device according to an embodiment of the present invention. From start as 24 in FIG. 5, the process includes detecting a current and a voltage of the battery device in the application using one or more current and voltage device coupled to an electronic circuit structure as 25 in FIG. 5. The process also includes capturing a current and a voltage of the battery device in the application using one or more current and voltage device coupled to an electronic circuit structure as 26 in FIG. 5. The process also includes processing the current value and the voltage value as 27 FIG. 5 and determining a state of charge of the battery device in a processing unit using a prediction-correction process as 28 in FIG. 5. The corrected predicted state of charge of the battery cell is the final estimated state of charge and is stored in a storage medium as 29 in FIG. 5. The process of the present invention also includes outputting the stating of charge as 30 in FIG. 5 and using the state of charge for the application as 31 in FIG. 5. The process can stop here as 32 in FIG. 5, or additional steps known by those skilled in the art can be added.

Figure 6:
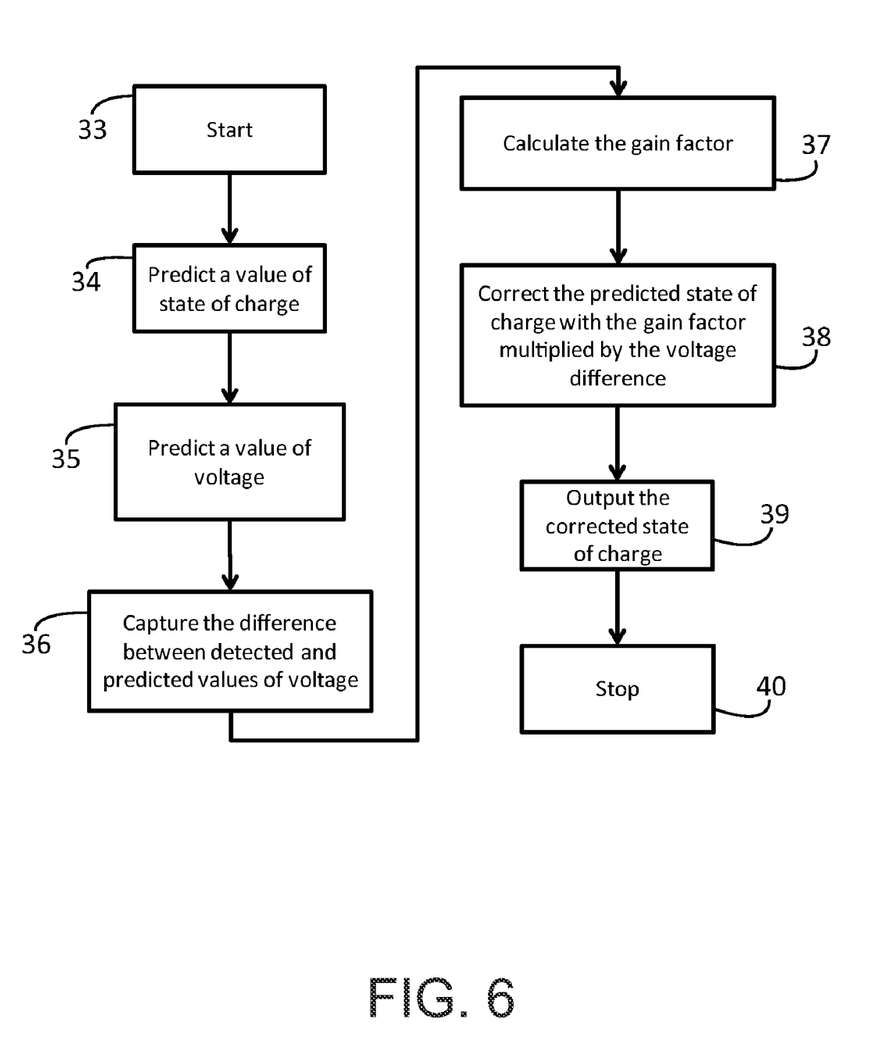
FIG. 6 is a simplified flow diagram of a prediction and a correction process.

FIG. 6 is a simplified flow diagram of a prediction-correction process. The process starts with predicting a value of state of charge of the battery cell as 34 in FIG. 6. The predicted value is the expectation of the state of charge calculated from unscented transform using sigma points. The expectation of the state of charge is:

$$\hat{x}_k^- = \sum_{i=0}^{2L} w_i^{(m)} \chi_{i,k|k-1}^x$$

where $w_i^{(m)}$ is the weight in unscented transform, L is the dimension of the state variable x (which is simply one-dimensional variable of state of charge when the state of charge is formulated as the only state variable), $\chi_{i,k|k-1}^x$ is the calculated state of charge from sigma points of variables from last time step:

$$\chi_{k|k-1}^x = F(\chi_{k-1}^x, u_{k-1}, \chi_{k-1}^v)$$

The sigma points are obtained by:

$$\chi_{k-1}^a = [\hat{x}_{k-1}^a \ \hat{x}_{k-1}^a + \gamma\sqrt{P_{k-1}^a} \ \hat{x}_{k-1}^a - \gamma\sqrt{P_{k-1}^a}]$$

where P is the covariance matrix, $x^a = [x^T \ v^T \ n^T]^T$, and $$\chi^a = [\ (\chi^x)^T \ (\chi^v)^T \ (\chi^n)^T \ ]^T.$$

v is the process noise and n is the sensor noise. $\gamma$ is the scaling factor in the unscented transform, $\gamma = \sqrt{L+\delta} \delta = \alpha^2 (L+k) - L \alpha$ is a constant and is usually set to a small positive value. k is a secondary scaling factor. The selection of sigma points is determined by the factor of k and the constant $\alpha$. The factor and the constant are conventionally specified with certain values a priori which potentially suffers from the difficulty of sigma point collapse. In the present invention, a Gaussian process optimization is used to estimate the factor and the constant. The Gaussian process optimization finds the maximum log marginal likelihood. The factor and the constant identified from the Gaussian process optimization yields better distributed sigma points and better estimation of the expectations and covariance of stochastic variables. Therefore the factor and the constant identified from the Gaussian process for selecting sigma points gives better accuracy for battery state of charge estimation.

The process of the present invention also includes predicting a voltage. The voltage is an expectation of the stochastic variable of voltage and is calculated by:

$$\hat{y}_k^- = \sum_{i=0}^{2L} w_i^{(m)} \psi_{i,k|k-1}^x, \ \psi_{k|k-1} = H(\chi_{k|k-1}^x, \chi_{k|k-1}^n).$$

The process further includes capturing the difference between the detected and predicted values of voltage ($\hat{y}_k - \hat{y}_k^-$). The mentioned process also includes calculating a gain factor $$\kappa_k = P_{xy,k} P_{yy,k}^{-1}$$

where:

$$P_{yy,k} = \sum_{i=0}^{2L} w_i^{(c)} (\psi_{i,k|k-1}^x - \hat{y}_k^-)(\psi_{i,k|k-1}^x - \hat{y}_k^-)^T,$$

$$P_{xy,k} = \sum_{i=0}^{2L} w_i^{(c)} (\chi_{i,k|k-1}^x - \hat{x}_k^-)(\psi_{i,k|k-1}^x - \hat{y}_k^-)^T$$

The process also includes correcting the predicted state of charge with the gain factor multiplied by the voltage difference:

$$\hat{x}_k = \hat{x}_k^- + \kappa_k (\hat{y}_k - \hat{y}_k^-)$$

Furthermore, the mentioned covariance matrix P is obtained by:

$$P_k = P_k^- - \kappa_k P_{yy,k} \kappa_k^T$$

$$P_k^- = \sum_{i=0}^{2L} w_i^{(c)} (\chi_{i,k|k-1}^x - \hat{x}_k^-)(\chi_{i,k|k-1}^x - \hat{x}_k^-)^T$$

The prediction-correction process also includes outputting the corrected state of charge as 39 in FIG. 6. When the battery equivalent circuit model parameters are concurrently estimated with battery state of charge, the aforementioned process is extended to include two prediction-correction processes for battery state of charge and battery equivalent circuit model parameters respectively. In this case, the innovation covariance for the parameter estimation process is calculated using a fixed forgetting factor or an exponentially annealed forgetting factor.

Further details of the present method and system can be found throughout the present specification and more particularly based upon the examples below

Example 1

Figure 7:
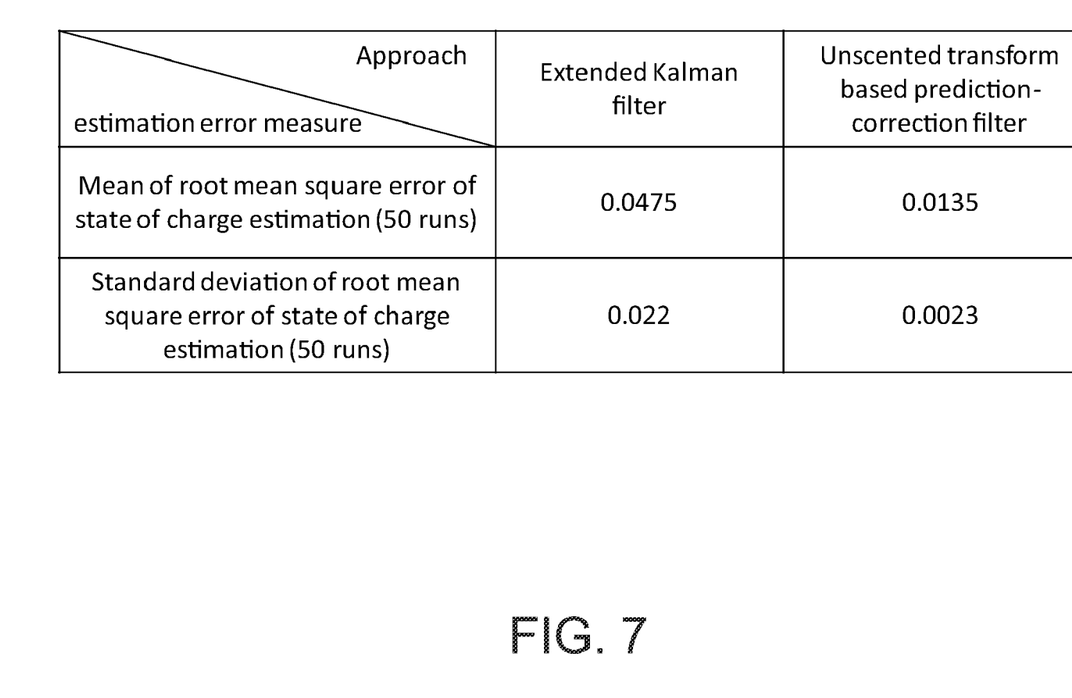
FIG. 7 is a simplified comparison of state of charge estimation performance between extended Kalman filter and unscented transform based prediction-correction filter

Comparison of Extend Kalman Filter and Unscented Transform Based Correction-Prediction Filter This example demonstrates the better performance of the unscented transform based correction-prediction filter over the conventional extended Kalman filter. For the purpose of demonstration, battery cell cycling test is replaced with multiphysics simulations, which serve completely the purpose of evaluating the performance of estimation filters. The process noise and sensor noise are mimicked by computer generated random numbers from a Gaussian distribution. Due to stochastic feature of the prediction-correction filter for battery state of charge estimation, the process is repeated 50 times. The root mean square error of state of charge estimation is recorded for each time of a run of the simulation. The mean and standard deviation of the root mean square error for the 50 runs are reported in FIG. 7. It is shown that unscented transform based prediction-correction filter performs much better than the conventional extended Kalman filter. In the present case, the unscented transform based prediction-correction filter yields a mean of root mean square error of 0.0135, while the extended Kalman filter yields a mean of root mean square error of 0.0457.

Example 2

SOC Estimation

Figure 8A:
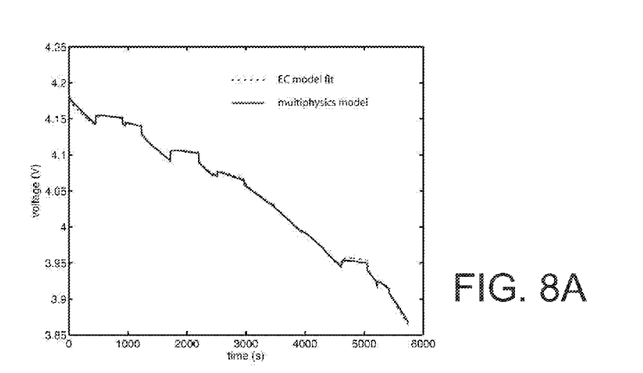
FIG. 8A-8C is a simplified illustration of comparison of predicted and measured voltage and state of charge values.
Figure 8B:
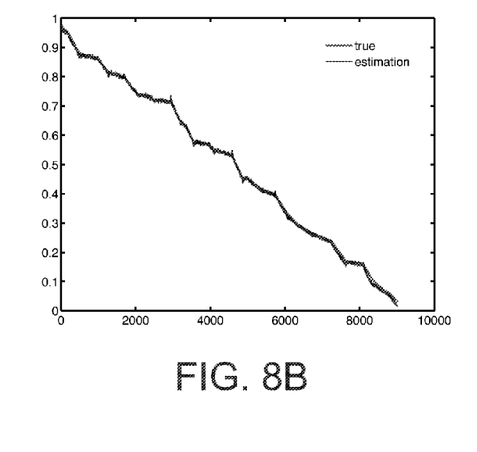
Figure 8C:
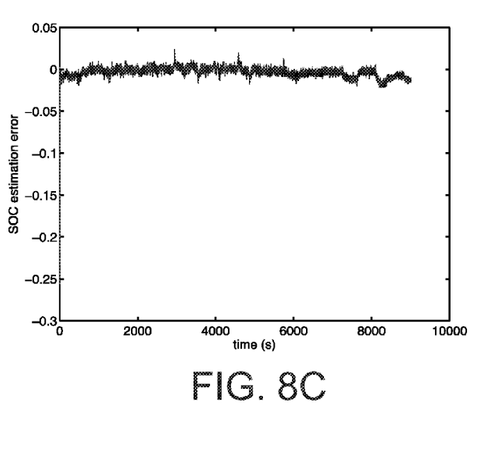

This example demonstrates the state of charge estimation of an electrochemical cell. As an example of the problems encountered by the battery designer, the precise state of charge for the present electrochemical cell setup is needed. In order to read the state of charge output and evaluate accuracy of the state of charge estimation, a computer aided system for a multi-physics model of the electrochemical system is used instead of a physical battery cycling system setup in the current example. The current load applied to the battery consists of randomly generated square waves (with random values for both amplitude and interval). In this example, a battery equivalent circuit model of EC-2 is used. The parameters of resistors and capacitors used in EC-2 are obtained a priori by fitting the voltage time history against the multi-physics simulation generated curve as shown in FIG. 8A. The obtained parameters are later used for the battery equivalent circuit model used in the unscented transform based prediction-correction filter process. Another randomly generated current load profile is generated and multi-physics simulation is conducted to obtain the true state of charge of the battery and the voltage of the battery. The current and voltage are used as input for the prediction-correction filter process. State of charge of the battery is estimated. The estimated state of charge is compared with the true state of charge as shown in FIG. 8B. The difference between the true and estimated state of charge is also shown in FIG. 8C. The average difference is less than 1%.

Example 3

EC-2 Models Battery Behavior Better than EC-1

Figure 9A:
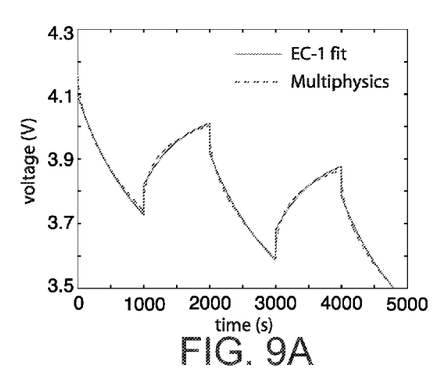
FIG. 9A-9D is a simplified illustration of comparison of predicted with EC-1 and EC-2 model and measured voltage and state of charge values.
Figure 9B:
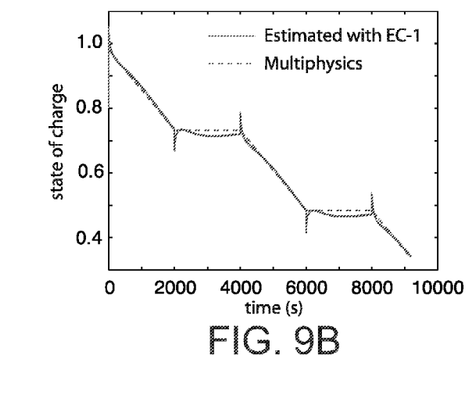
Figure 9C:
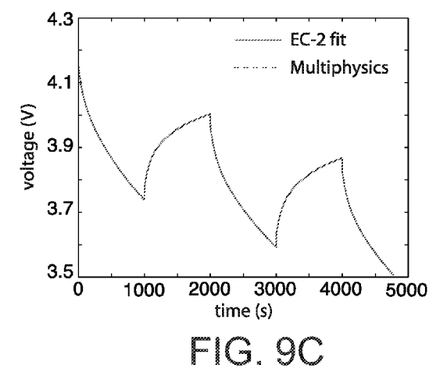
Figure 9D:
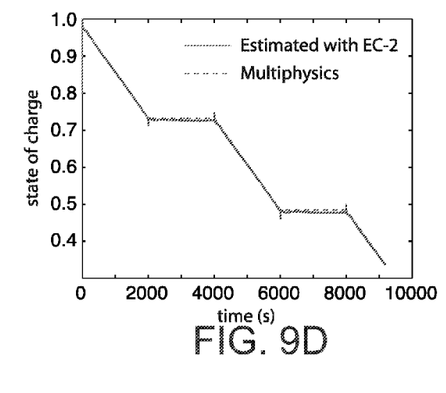

This example demonstrates the state of charge and voltage estimation of an electrochemical cell by using EC-1 and EC-2 battery equivalent circuit models. As an example of the problems encountered by the battery designer, the precise state of charge for the present electrochemical cell setup is needed. In order to read the state of charge and voltage output and evaluate accuracy of the state of charge and voltage estimation, a computer aided system for a multi-physics model of the electrochemical system is used instead of a physical battery cycling system setup in the current example. The discharge current used in this example consists of regular square waves with fixed amplitude and temporal interval. In this example, battery equivalent circuit models with EC-1 and EC-2 are used to fit the multi-physic simulation generated discharge voltage curves. It is shown that EC-2 is able to fit the multi-physics simulation generated voltage curve better than EC-1 does as illustrated in FIGS. 9A and C. The fitted parameters are used in the equivalent circuit models of EC-1 and EC-2 which are later used for state of charge estimation by unscented transform based prediction-correction filter. It is shown that EC-2 model yields more accurate estimation of battery state of charge than EC-1 model does as illustrated in FIGS. 9B and D.

While the above is a full description of the specific embodiments, various modifications, alternative constructions and equivalents may be used. Therefore, the above description and illustrations should not be taken as limiting the scope of the present invention which is defined by the appended claims.

What is claimed is:

1. A method for operating an application, the application is selected from one of a mobile communication device, a vehicle, display device, or computing device, the method including a process for monitoring and predicting a state of a battery device while the battery device is configured with the application, comprising:

detecting, by a processor, a current and a voltage of the battery device in the application using one or more sensing device coupled to an electronic circuit structure;

capturing, by a processor, a current value associated with the current and a voltage value associated with the voltage;

processing, by a processor, the current value and the voltage value;

determining, by a processor, a state of charge of the battery device using at least a prediction-correction process including the current value and the voltage value, an arbitrary number of representative resistors and capacitors associated with a battery equivalent circuit model, and an unscented transform;

storing, by a processor, the state of charge in one or more memories;

outputting, by a processor, the stating of charge; and using the state of charge for the application;

whereupon the unscented filter transform comprises a Gaussian process for selection of more than two Sigma points.

2. The method of claim 1 wherein battery equivalent circuit models consist of at least an ideal DC power source, internal resistance, and an arbitrary number of representative parallel resistors and capacitors.

3. The method of claim 2 wherein said battery equivalent circuit model uses parameters for resistors and capacitors, the parameters being obtained a priori by fitting the equivalent circuit model to battery testing data, the parameters able to be obtained concurrently or jointly with state of charge of the battery cell.

4. The method of claim 1 wherein the prediction-correction process comprises:
predicting a value of battery state of charge;
predicting a value of battery voltage;
determining a difference between the measured voltage and a predicted voltage to obtain a voltage difference value;
multiplying the difference value by a gain factor to obtain a correction value;
adding the correction value to the predicted cell state of charge to obtain a corrected predicted state of charge of the battery cell; and
storing the corrected state of charge of the battery cell in a storage medium.

5. The method of claim 4 wherein said gain factor is determined by dividing the covariance of the stochastic variables of voltage and state of charge by the covariance of stochastic variable of voltage and voltage.

6. The method of claim 4 wherein said predicted voltage is the expectation of the predicted stochastic variable voltage, the expectation being obtained by an unscented transform.

7. The method of claim 1 wherein the electronic circuit structure comprises voltage sensing devices, current sensing devices, resistors, capacitors, electronic amplifier, analog-to-digital converters.

8. The method of claim 1 wherein the unscented transform comprises a priori or a Gaussian process optimization for selection of more than two Sigma points to approximate the expectation and covariance of stochastic variables such as state of charge and voltage of a battery.

9. The method of claim 1 wherein the outputting comprises a state of charge, a voltage, a current, and a corresponding time.

10. The method of claim 1 wherein the arbitrary number includes any positive integer and zero.

11. The method of claim 1 wherein said unscented transform based prediction-correction filter calculates the innovation covariance for parameter estimation using a fixed forgetting factor or an exponentially annealed forgetting factor when the battery equivalent circuit model parameters are concurrently estimated with battery state of charge.

12. A method for operating an application, the application is selected from one of a mobile communication device, a vehicle, display device, or computing device, the method including a process for monitoring and predicting a state of a battery device while the battery device is configured with the application, comprising:
detecting, by a processor, a current and a voltage of the battery device in the application using one or more sensing device coupled to an electronic circuit structure;
capturing, by a processor, a current value associated with the current and a voltage value associated with the voltage;
processing, by a processor, the current value and the voltage value using an arbitrary number of representative resistors and capacitors associated with a battery equivalent circuit model and an unscented transform, the unscented filter transform comprising a Gaussian process for selection of more than two Sigma points;
predicting a value of battery state of charge;
predicting a value of battery voltage;
determining, by a processor, a difference between the measured voltage and a predicted voltage to obtain a voltage difference value;
multiplying the difference value by a gain factor to obtain a correction value;
adding the correction value to the predicted cell state of charge to obtain a corrected predicted state of charge of the battery cell;
storing, by a processor, the corrected state of charge of the battery cell in a storage medium;
outputting, by a processor, the stating of charge; and
using the state of charge for the application.

13. The method of claim 12 wherein said gain factor is determined by dividing the covariance of the stochastic variables of voltage and state of charge by the covariance of stochastic variable of voltage and voltage.

14. The method of claim 12 wherein said predicted voltage is the expectation of the predicted stochastic variable voltage, the expectation being obtained by an unscented transform.

15. The method of claim 12 wherein the electronic circuit structure comprises voltage sensing devices, current sensing devices, resistors, capacitors, electronic amplifier, analog-to-digital converters.

16. The method of claim 12 wherein the unscented transform comprises a priori or a Gaussian process optimization for selection of more than two Sigma points to approximate the expectation and covariance of stochastic variables such as state of charge and voltage of a battery.

17. The method of claim 12 wherein the outputting comprises a state of charge, a voltage, a current, and a corresponding time.

18. The method of claim 12 wherein said unscented transform based prediction-correction filter calculates the innovation covariance for parameter estimation using a fixed forgetting factor or an exponentially annealed forgetting factor when the battery equivalent circuit model parameters are concurrently estimated with battery state of charge.

19. A system for operating an application, the application is selected from one of a mobile communication device, a vehicle, display device, or computing device, the method including a process for monitoring and predicting a state of a battery device while the battery device is configured with the application, comprising:
at least one sensing device configured for detecting a current value and a voltage value of the battery device in the application;
an electronic circuit configured for capturing the current value associated with the current and the voltage value associated with the voltage; and
a processing unit coupled to the electronic circuit, the processing unit configured to execute one or more instructions, the one or more instructions including a process for
determining a state of charge of the battery device using at least a prediction-correction process including the current value and the voltage value, an arbitrary number of representative resistors and capacitors associated with a battery model, an unscented transform comprising a Gaussian process for selection of more than two Sigma points, and one or more memory device configured to store a value associated with the state of charge.

20. The system of claim 19 further comprising an output device to display the value associated with the state of charge.

* * * * *